(12) United States Patent
Ishioka et al.

(10) Patent No.: US 6,703,849 B2
(45) Date of Patent: Mar. 9, 2004

(54) INSPECTION APPARATUS, INSPECTION METHOD AND INSPECTION UNIT THEREFOR

(75) Inventors: Shogo Ishioka, Fukayasu-gun (JP); Shuji Yamaoka, Fukuyama (JP)

(73) Assignee: OHT Inc., Kannabe-cho (JP)

( * ) Notice: Subject to any disclaimer, the term of this patent is extended or adjusted under 35 U.S.C. 154(b) by 51 days.

(21) Appl. No.: 09/926,301
(22) PCT Filed: Feb. 9, 2001
(86) PCT No.: PCT/JP01/00908
§ 371 (c)(1),
(2), (4) Date: Oct. 9, 2001
(87) PCT Pub. No.: WO01/59469
PCT Pub. Date: Aug. 16, 2001

(65) Prior Publication Data
US 2002/0140442 A1 Oct. 3, 2002

(30) Foreign Application Priority Data
Feb. 10, 2000 (JP) ........................................ 2000-033732

(51) Int. Cl.$^7$ .............................................. G01R 31/02
(52) U.S. Cl. ...................................... 324/750; 324/538
(58) Field of Search ................................ 324/538, 537, 324/501, 519, 522, 523, 525, 527, 459, 750

(56) References Cited

U.S. PATENT DOCUMENTS

| 4,565,966 A | * | 1/1986 | Burr et al. .................. 324/519 |
| 4,705,329 A | * | 11/1987 | Doemens .................... 324/459 |
| 4,771,230 A | * | 9/1988 | Zeh ............................ 324/459 |
| 6,097,202 A | * | 8/2000 | Takahashi .................. 324/761 |
| 6,154,038 A | * | 11/2000 | Ito et al. .................... 324/750 |

\* cited by examiner

*Primary Examiner*—Ernest Karlsen
(74) *Attorney, Agent, or Firm*—Westerman, Hattori, Daniels & Adrian, LLP

(57) ABSTRACT

The present invention provides an inspection apparatus, an inspection method and an inspection unit therefor capable of inspecting a conductive pattern in a complete non-contact manner. In the method for inspecting a conductive pattern of a circuit board in a complete non-contact manner, a plurality of electrically conductive cells 11 are arranged along the conductive pattern of the circuit board 100 with leaving a space therebetween. An inspection signal having temporal variations is supplied to at least one of the cells 11 in the conductive pattern without using any pin. An output signal appearing at another at least one of the cells through the conductive pattern in response to the applied inspection signal is detected. The conductive pattern is inspected based on the detected output signal.

17 Claims, 15 Drawing Sheets

INSPECTION APPARATUS, INSPECTION METHOD AND INSPECTION UNIT THEREFOR

TECHNICAL FIELD

The present invention relates to an inspection of conductive patterns formed on a circuit board.

BACKGROUND ART

In manufacturing processes of a circuit board, after forming electrically conductive patterns on a board, it is required to inspect the presence of disconnection and/or short-circuit in the conductive patterns.

As for such an inspection technique, a contact type inspection technique has been heretofore known in which a conductive pattern was subjected to a continuity check or the like by bringing two separate pins into contact with the opposite ends of the conductive pattern to apply an electric signal from one of the two pins to the conductive pattern and then receive the electric signal through the other pin.

However, recent progressive densification in the conductive patterns makes it difficult to bring the pins into contact with each of the conductive patterns from point to point precisely. Thus, a non-contact type inspection method has been proposed in which no pin was used at the receiving side and the electric signal was received without contacting the conductive pattern.

In this non-contact type inspection technique, a pin to be contacted to the conductive pattern is placed at one end of the conductive pattern, and a sensor is placed adjacent to the other end of the conductive pattern in a non-contact manner. Then, an electric signal having temporal variations is supplied to the pin, and a corresponding electric signal which appears at the sensor after passing through the capacitance lying between the conductive pattern and the sensor is detected to inspect the disconnection and others of the conductive pattern.

According to this technique, the inspection can be adequately performed by bringing the pin into contact with only one end of the conductive pattern. Thus, this technique is advantageous particularly to the inspection of microscopic conductive patterns.

However, the conventional non-contact type inspection technique is required to bring the pin into contact with one end of the conductive pattern and thereby the inspection cannot be carried out in a complete non-contact manner. Thus, considering recent further progressive densification in the conductive patterns, such a conventional technique can be limited in the scope of applications. In addition, it is required to provide a pad for bringing the pin into contact therewith at one end of the conductive pattern. Providing such an originally unnecessary pad runs counter to enhancing packaging density.

It is therefore an object of the present invention to provide an inspection apparatus, an inspection method and an inspection unit therefor capable of inspecting conductive patterns in a complete non-contact manner.

DISCLOSURE OF THE INVENTION

According to one aspect of the present invention, there is provided an inspection apparatus for inspecting a conductive pattern of a circuit board in a non-contact manner, comprising a plurality of conductive cells arranged with leaving a space therebetween, supply means for supplying an inspection signal having temporal variations to at least one of the cells, processing means for processing an output signal appearing at another at least one of the cells, switching means for allowing each of the cells to be connected individually with either one of the supply means and the processing means, and control means for controlling the switching means.

In this aspect of the present invention, the inspected conductive pattern and the cells will be capacitively coupled to each other by placing the cells close to the conductive pattern. Thus, once the inspection signal is supplied to one of the cells, a signal appears at the conductive pattern in response to the inspection signal, and thereby a signal (output signal) appears at another ones of the cells.

Then, connecting each of the cells with either one of the supply means and the processing means by the switching means allows the conductive pattern to be inspected in a complete non-contact manner without using any pins.

According another aspect of the present invention, there is provided an inspecting unit for inspecting a conductive pattern of a circuit board in a non-contact manner, comprising a plurality of conductive cells arranged with leaving a space therebetween, an input terminal receiving an inspection signal to be supplied to at least one of the cells, an output terminal for outputting a signal from another at least one of the cells, a control terminal receiving a control signal for selecting a specific cell from the cells, and switching means for allowing each of the sells to be connected individually with either one of the input terminal and the output terminal based on the control signal.

In this aspect of the present invention, the inspected conductive pattern and the cells will be capacitively coupled to each other by placing the cells close to the conductive pattern. Thus, once the inspection signal is supplied to one of the cells, a signal appears at the conductive pattern in response to the inspection signal, and thereby a signal (output signal) appears at another ones of the cells.

Then, connecting each of the cells with either one of the input terminal and the output terminal by the switching means allows the conductive pattern to be inspected in a complete non-contact manner without using any pins.

According still another aspect of the present invention, there is provided an inspection method for inspecting an conductive pattern of a circuit board in a non-contact manner, comprising the steps of placing a plurality of conductive cells along the conductive pattern with leaving a space therebetween, supplying an inspection signal having temporal variations to at least one of the cells, detecting an output signal appearing at another one of the cells through the conductive pattern in response to the applied inspection signal, and inspecting the conductive pattern based on the detected output signal.

In this aspect of the present invention, the inspected conductive pattern and the cells will be capacitively coupled to each other by placing the cells along the conductive pattern. Thus, the inspection signal can be supplied to the conductive pattern by supplying the inspection signal to the one of the cells. Further, a signal appears at the conductive pattern in response to the inspection signal, and thereby a signal (output signal) appears at another one of the cells. By detecting this signal, the conductive pattern can be inspected. This allows the conductive pattern to be inspected in a complete non-contact manner without using any pins.

BEST MODE FOR CARRING OUT THE INVENTION

Figure 1:
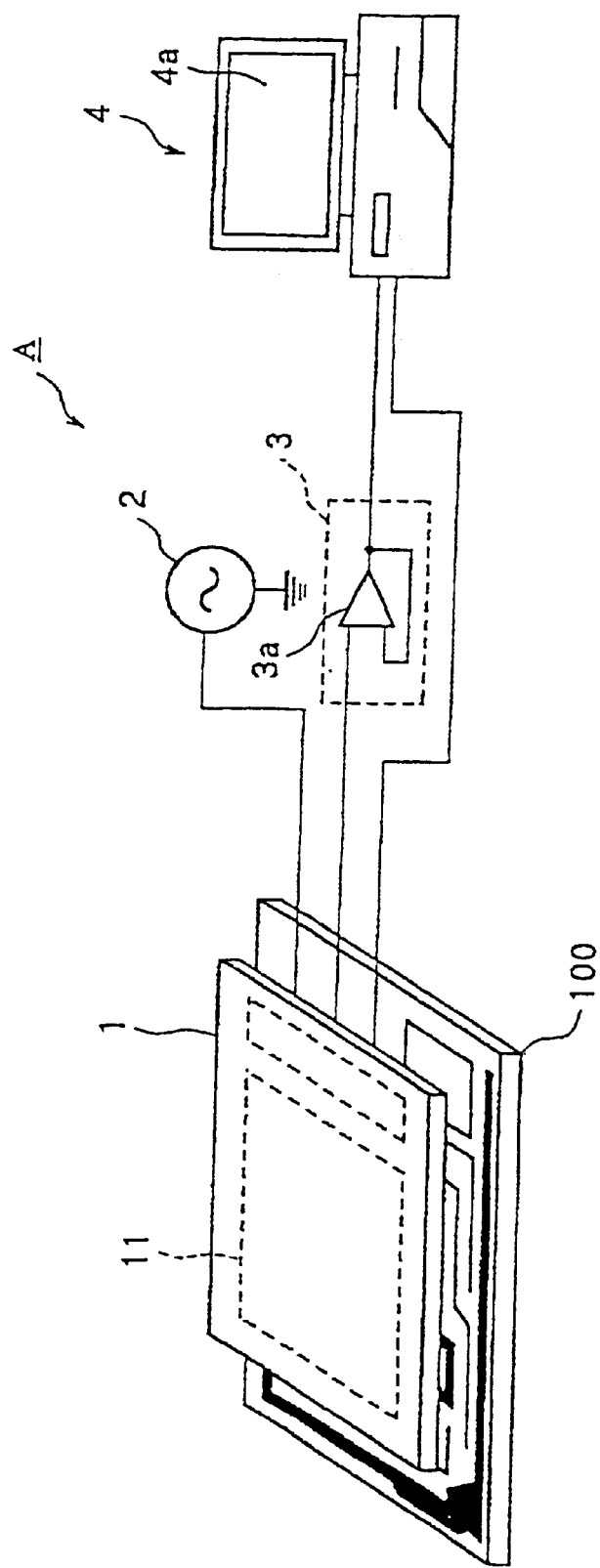
FIG. 1 is a block diagram showing an inspection apparatus A according to one embodiment of the present invention.
Figure 2:
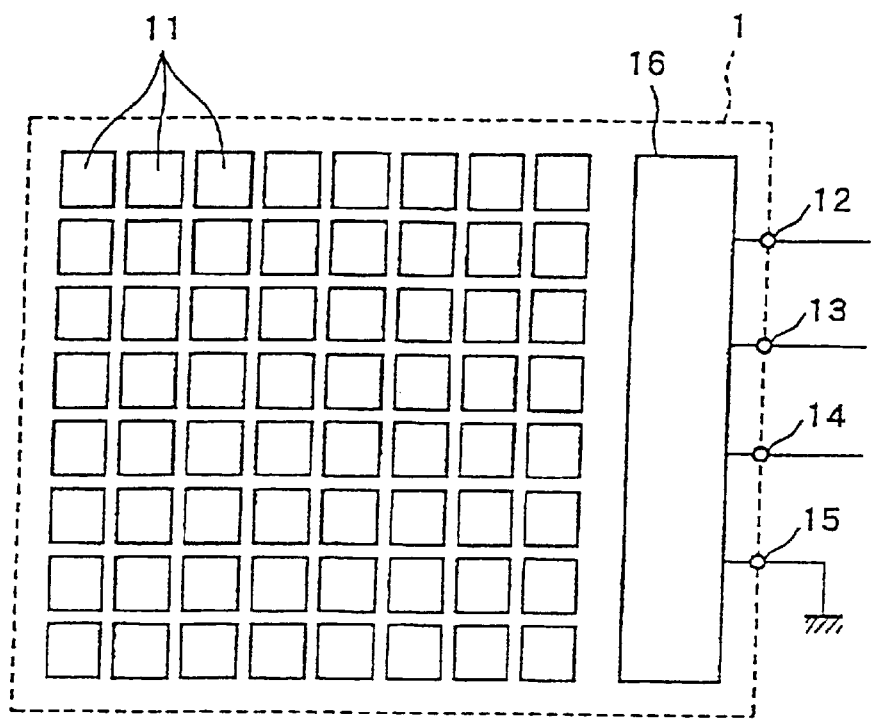
FIG. 2 is a block diagram showing an inspection unit 1.

FIG. 1 is a block diagram showing an inspection apparatus A for inspecting electrically conductive patterns formed on a circuit board 100 according to one embodiment of the present invention. FIG. 2 is a block diagram showing an inspection unit 1.

<Construction of the Inspection Apparatus A>

An inspection apparatus A comprises an inspection unit 1, an inspection signal source 2 for supplying an inspection signal to the inspection unit 1, a processing circuit 3 for processing an output signal from the inspection unit 1, and a computer 4 for determining the presence of disconnection, short circuit and others in electrically conductive patterns formed on a circuit board 100.

The inspection unit 1 includes a plurality of electrically conductive cells 11 with leaving a space therebetween, an input terminal 12 receiving the inspection signal from the signal source 2, an output terminal 13 for outputting the output signal from each of the cells 11, a control terminal 14 receiving a control signal from the computer 4, a GND terminal 15 connected with the GND, and a switching circuit 16 for selectively connecting each of the cells 11 with either one of the input terminal 12, output terminal 13 and GND terminal 15.

The inspection unit 1 has a surface over which the cells 11 are exposed, and this surface is positioned opposed to the conductive patterns of the circuit board 100 in an actual inspecting operation. Preferably, the distance between the cells 11 and the conductive patterns is in the range of about 0.05 mm to 0.5 mm. The embodiment in FIG. 1 is constructed on the assumption that the conductive patterns are formed only on one side surface of the circuit board 100. However, if the conductive patterns are formed on both side surfaces of the circuit board 100, the inspecting operation may be performed by preparing a pair of the inspection units 1 and sandwiching the circuit board between the pair of the inspection units 1.

In the inspection apparatus A, the inspection signal is applied to selected one of the cells 11 to generate an electric signal on selected one of the conductive patterns, and this conductive pattern is inspected based on an signal appearing at another one of the cells 11 (hereinafter referred to as "output signal"). The basic principal of the inspecting operation will be described later.

In the inspection unit 1, each cell 11 is formed of an electrically conductive material, such as metals including aluminum or copper, or semiconducting materials. While the cells 11 are arranged two-dimensionally in conformity with the shape of the inspection unit 1, a three-dimensional arrangement may also be used.

As shown in FIG. 2, all of the cells 11 are preferably uniformed in shape, because this allows each cell 11 to supply the inspection signal to the conductive pattern and receive the signal appearing at the conductive pattern without any deviation.

Figure 3:
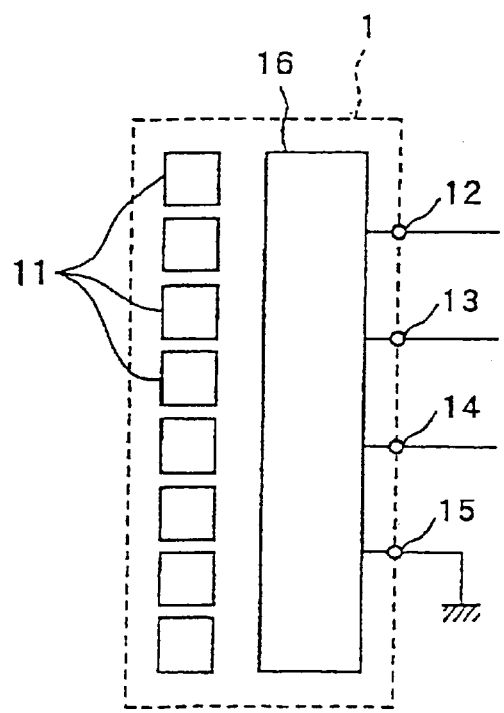
FIG. 3 is a block diagram showing another example of the inspection unit 1.

Further, as shown in FIG. 2, the cells 11 is preferably arranged in a matrix form in which eight cells 11 are arranged at even intervals respectively in row and column directions, because this arrangement makes it possible not only to reduce the unevenness in the number of the cells 11 per a unit area opposed to the conductive pattern but also to clarify the relative physical relationship between respective cells 11 so as to readily specify each position of the cells 11. However, as shown in FIG. 3, only a single column of cells may be arranged depending on the shape of the circuit board 100 to be inspected.

While the total number of the cells 11 is sixty four in the inspection unit 1, the number has been selected only to simplify the description of this embodiment, and practically, the cells in the range of 200,000 to 2,000,000 may be arranged in the range of 5 $\mu m^2$ to 50 $\mu m^2$. In order to achieve an accurate inspection, the size of each cell 11 and the space between adjacent cells 11 are preferably set to allow about two cells to be contained within the line width of the conductive pattern.

The switching circuit 16 may, for example, be composed of a multiplexer or duplexer.

Figure 4:
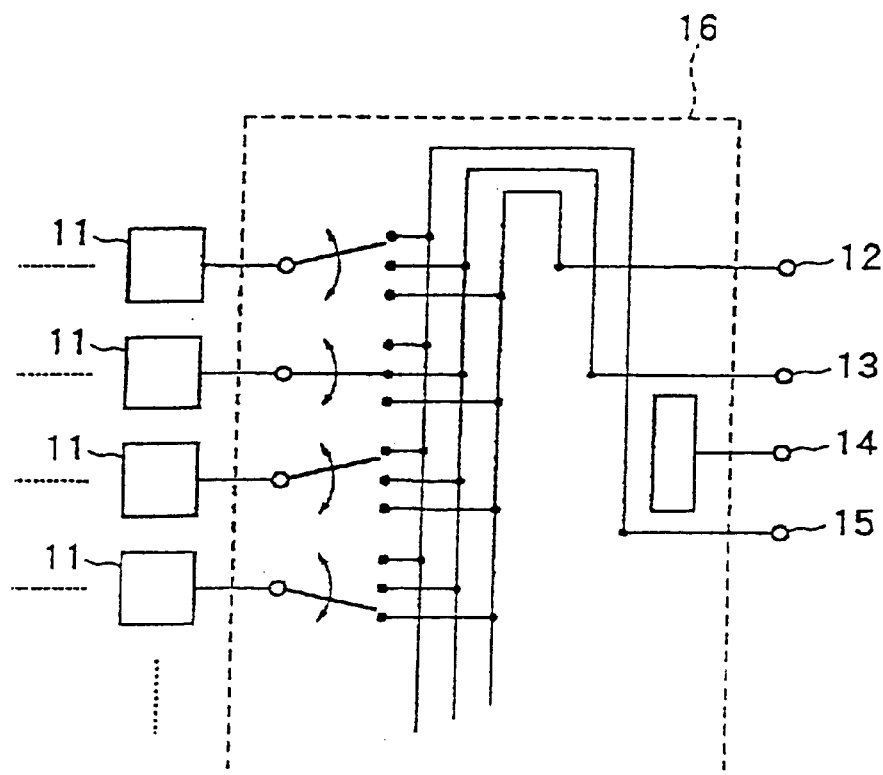
FIG. 4 is an internal block diagram showing a switching circuit 16.

FIG. 4 is an internal block diagram of the switching circuit 16. The switching circuit 16 connects each of the cells 11 individually with either one of the input terminal 12, the output terminal 14 and the GND terminal 15 in response to the control signal from the computer 4. In the following description, an operation of connecting each of the cell 11 with the input terminal 12 will be referred to as "switching to signal-supply side", and an operation of connecting each of the cell 11 with the output terminal 13 will be referred to as "switching to signal-receive side".

Since this embodiment includes only one output terminal 13, only one cell 11 can be connected with the output terminal 13. However, the output terminals 13 may be provided for each of the cells 11 to acquire signals simultaneously from a plurality of cells 11. The reason for allowing each of the cells 11 to be connected with the GND terminal 15 is to provide an enhanced S/N ratio of the output signal acquired from either one of the cells 11. However, if a sufficient S/N ratio can be obtained without connecting each of the cells 11 to the GND terminal 15, each of cells 11 may be simply switched to be left open.

The inspection signal source 2 is adapted to continuously generate the inspection signal having temporal variations or varying over time, such as AC signals or pulse signals, or an electric signal having a cyclically varying voltage as in this embodiment. For example, the frequency of the voltage variations in the inspection signal is preferably in the range of 500 kHz to 10 MHz. While the inspection signal source 2 is provided as a separate component in this embodiment, the computer 4 may be configured to generate such an inspection signal.

The processing circuit 3 serves as a signal-conditioning device to facilitate the processing of the output signal from each of the cells 11 in the computer 4. The processing circuit 3 may include a filter circuit and/or an A/D converter in addition to an amplifier 3a for amplifying the output signal from each of the cells 11 as shown in FIG. 1.

The computer 4 transmits the control signal to the switching circuit 16 to set an adequate terminal (12, 13 or 15) to be connected with each of the cells 11 and to determine the presence of disconnection, short circuit or chipping in the inspected conductive pattern.

Further, the computer 4 has a function to indicate an image of the inspected conductive pattern on a display 4a based on the output signal from each of the cells 11 and other information.

<Basic Principle of the Inspection Operation>

Figure 5:
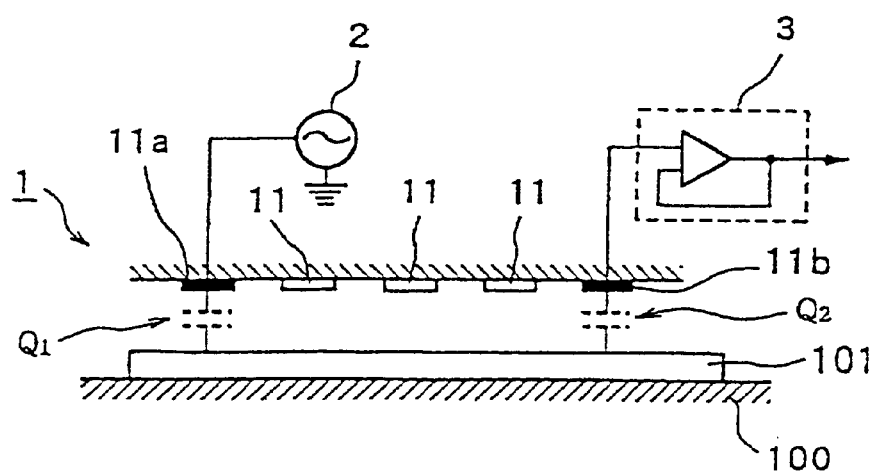
FIG. 5 is an explanatory view of a basic principle of an inspecting operation.

FIG. 5 shows the basic principle of the inspecting operation. In FIG. 5, assuming that an electrically conductive cell 11a is switched to the signal-supply side, and another electrically conductive cell 11b is switched to the signal-receive side. The cell 11a and the conductive pattern 101 on the circuit board 100 located directly below the cell 11a are capacitively coupled by virtue of an air or atmosphere in the inspection environment existing therebetween and serving as a dielectric substance. Thus, once the inspection signal is input from the signal source 2 to the cell 11a, the varying voltage of the inspection signal will cause a current in the conductive pattern 101.

On the other hand, since the cell 11b and the conductive pattern 101 are capacitively coupled to each other, the current generated in the conductive pattern 101 flows into the cells 11 (the output signal).

Then, for example, the presence of disconnection in the inspected conductive pattern 101 can be determined base on the magnitude of the intensity of the output signal (e.g. the amplitude of the voltage).

<<Inspection Method 1>>

<Operation for Inspecting Disconnection>

Figure 6:
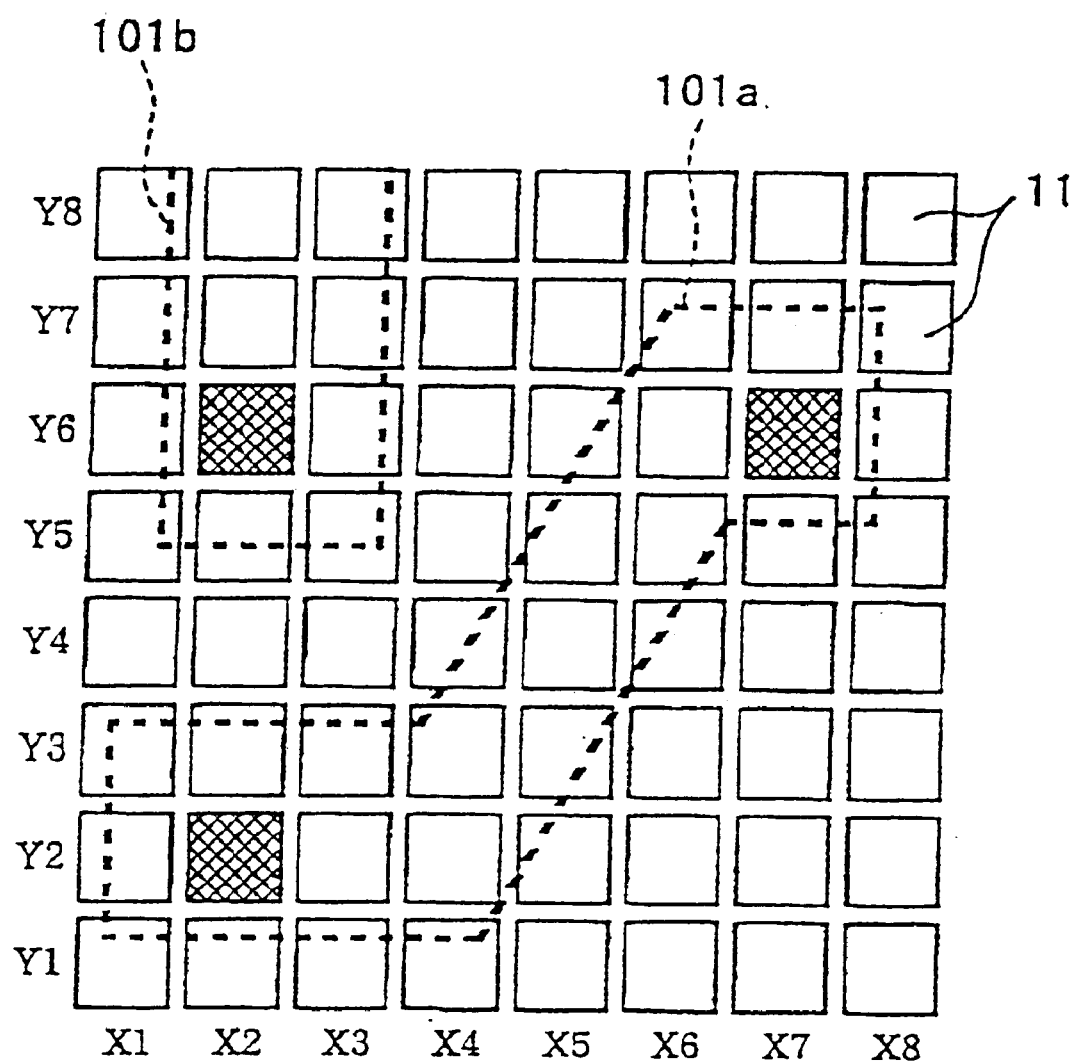
FIG. 6 shows a physical relationship between inspected conductive patterns 101a, 101b and each of cells 11.

An operation for inspecting disconnection in the conductive pattern by use of the inspection apparatus A will now be described. FIG. 6 shows a physical relationship between the conductive patterns 101a, 101b (shown by dotted lines) and each of the cells 11. In FIG. 6, the reference marks X1 to X8 and Y1 to Y8 indicate coordinates to specify each of the cells 11. In the following description, the representation "cell (X1, Y1) means the cell located at the coordinate (X1, Y1).

In the operation for inspecting the presence of disconnection in the conductive pattern 101a, the computer 4 first selects one cell 11 or a group of cells 11 to be switched to the signal-supply side and one cell 11 or a group of cells 11 to be switched to the signal-receive side, from the cells 11 placed above the conductive pattern 101a. In this selecting operation, it is preferable to select the cell(s) 11 located as closely to the both ends of the conductive pattern 101a as possible, because the part of the conductive pattern 101a lying between the cell(s) 11 switched to the signal-supply side and the cell(s) 11 switched to the signal-receive side can be subjected to this operation for inspecting disconnection.

For example, supposing that the cell (X2, Y2) is selected as the cell to be switched to the signal-supply side and the cell (X7, Y6) is selected as the cell to be switched to the signal-receive side, the computer 4 transmits the control signal to the switching circuit 16 of the inspection unit 1 to make the cell (X2, Y2), the cell (X7, Y6) and the remaining cells 11 connect with the input terminal 12, the output terminal 13 and the GND terminal 15, respectively. When a plurality of cells 11 are selected as the cells to be switched to the signal-supply side, all of the selected cells 11 can be switched simultaneously. On the other hand, when a plurality of cells 11 are selected as the cells to be switched to the signal-receive side, all of the selected cells 11 are not switched simultaneously but the selected cells 11 will be switched in a sequential order.

Then, the inspection signal from the signal source 2 is input to the cell (X2, Y2). Thus, a current is caused in the conductive pattern 101a and the output signal is generated from the cell (X7, Y6). The generated output signal is transmitted to the computer 4 through the processing circuit 3, and then the computer 4 determines the presence of disconnection based on the intensity of the output signal.

Figure 7:
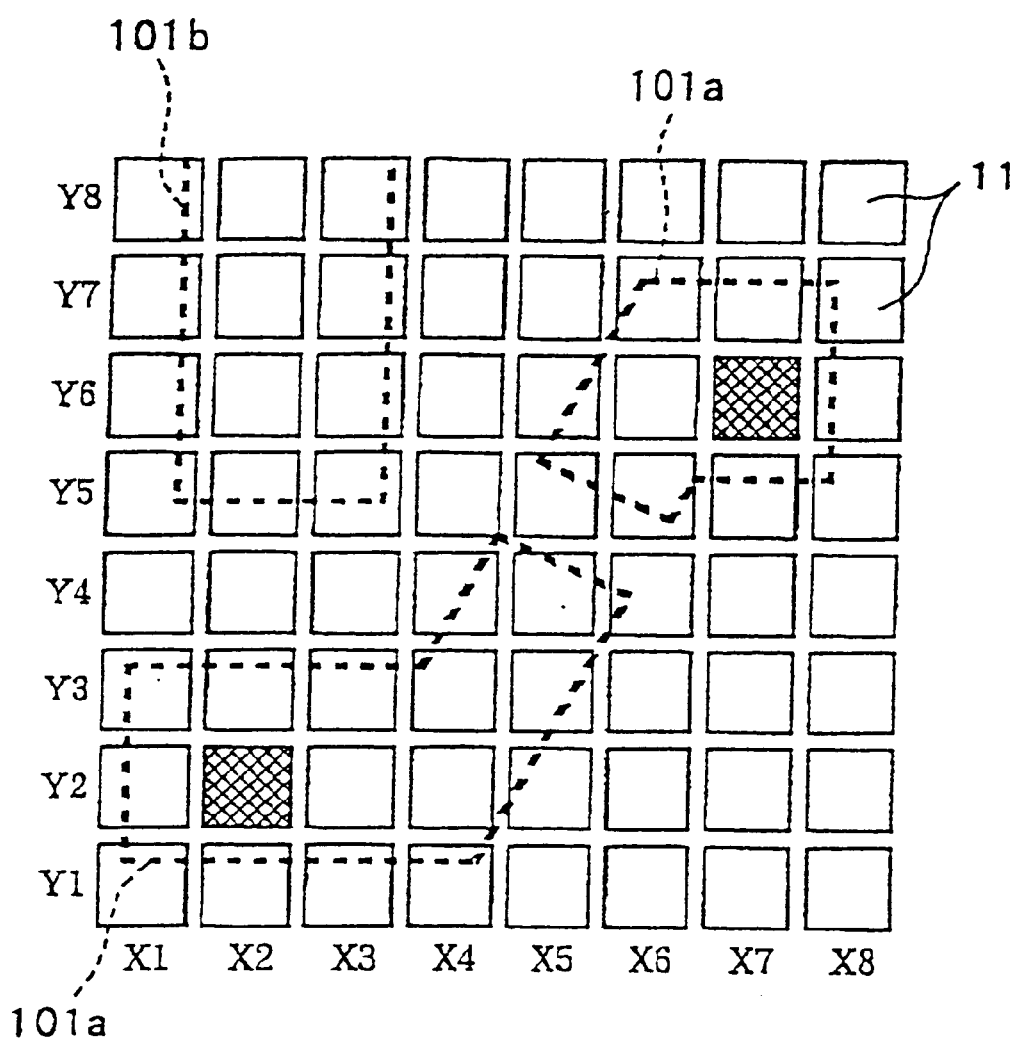
FIG. 7 shows a state when a disconnection is caused in the conductive pattern 101a in FIG. 6.

The computer 4 determines the presence of disconnection in the conductive pattern 101a based on whether the intensity of the output signal is higher or lower than a given threshold value. For example, if the conductive pattern 101a is disconnected in the middle portion of the conductive pattern 101a as shown in FIG. 7, the output signal from the cell (X7, Y6) will be relatively lowered. Thus, it can be determined that the conductive pattern 101a has a specific disconnection. On the other hand, if the conductive pattern 101a is continuously connected as shown in FIG. 6, the output signal from the cell (X7, Y6) will be relatively turned up. Thus, it can be determined that the conductive pattern 101a has no disconnection. The reason why some output signal is generated even if the conductive pattern 101a is disconnected can be supposed that respective disconnected portions of the conductive pattern 101a are also capacitively coupled to each other.

The threshold value for determining the presence of disconnection can be set by carrying out a pilot study in case of having a specific disconnection and of having no disconnection using dummy conductive patterns.

Alternatively, the presence of disconnection may be determined without using the threshold value. Specifically, a plurality of conductive patterns are inspected, and then respective intensities of the output signals obtained from the inspecting operations are compared with each other. Base on this comparison, it can be determined that the conductive pattern having relatively lower intensity of the output signal has a specific disconnection, and the conductive pattern having relatively high intensity of the output signal has no disconnection.

<Operation for Inspecting Short Circuit>

An operation for inspecting short circuit in the conducting patter by use of the inspection apparatus A will now be described.

In the operation for inspecting the presence of short circuit between the conductive patterns 101a and 101b in FIG. 6, the computer 4 first selects one cell 11 or a group of cells 11 to be switched to the signal-supply side and one cell 11 or a group of cells 11 to be switched to the signal-receive side, from the cells 11 placed above the conductive pattern 101a or 101b.

As a result of the above selecting operation, for example, supposing that the cell (X2, Y2) is selected as the cell to be switched to the signal-supply side and the cell (X2, Y6) is selected as the cell to be switched to the signal-receive side, the computer 4 transmits the control signal to the switching circuit 16 of the inspection unit 1 to make the cell (X2, Y2), the cell (X2, Y6) and the remaining cells 11 connect with the input terminal 12, the output terminal 13 and the GND terminal 15, respectively. When a plurality of cells 11 are selected as the cells to be switched to the signal-supply side, all of the selected cells 11 can be switched simultaneously. On the other hand, when a plurality of cells 11 are selected as the cells to be switched to the signal-receive side, all of the selected cells 11 are not switched simultaneously but the selected cells 11 will be switched in a sequential order.

Figure 8:
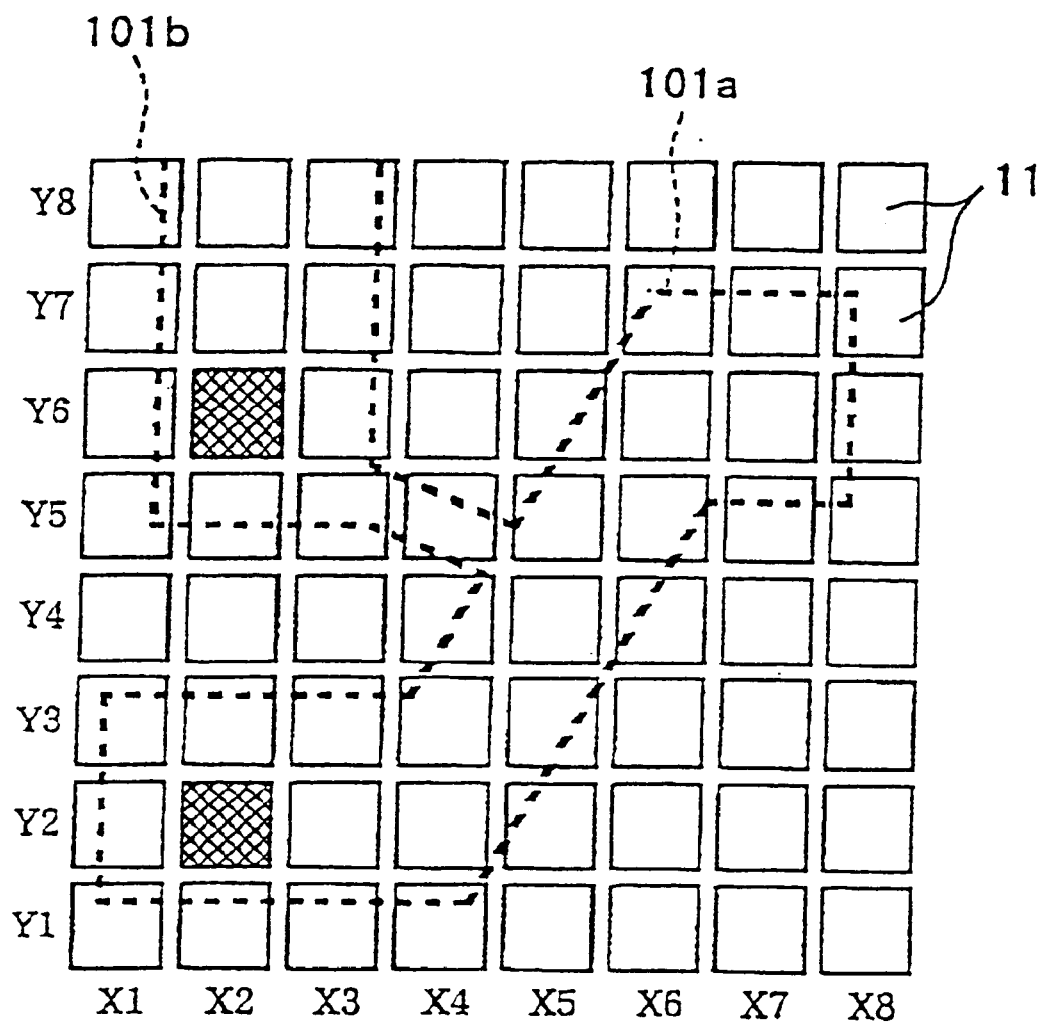
FIG. 8 shows a state when a short circuit is caused between the conductive patterns 101a, 101b in FIG. 6.

Then, the inspection signal from the signal source 2 is input to the cell (X2, Y2). In this moment, if the conductive patterns 101a and 101b are short-circuited as shown in FIG. 8, a current flows through these conductive patterns and the output signal is generated at the cell (X2, Y6). The generated output signal is transmitted to the computer 4 through the processing circuit 3, and then the computer 4 determines the presence of short circuit based on the intensity of the output signal.

As with the operation for inspecting disconnection, the computer 4 determines the presence of short circuit between the conductive patterns 110a and 101b based on whether the intensity of the output signal is higher or lower than a given threshold value or the comparison with the intensity of the output signal in other operation for inspecting short circuit. The reason why some output signal is generated even if the conductive patterns 101a and 101b are not short-circuited can be supposed that the conductive patterns 101a and 101b having no short circuit are also capacitively coupled to each other.

<<Inspection Method 2>>

An operation for inspecting the presence of disconnection, short circuit and chipping in the conductive pattern 101(a, b) by forming an image based on the output signal from the cell(s) 11 will now be described.

<Operation for Detecting Coordinate of Conductive Pattern>

First, the physical relationship between the inspected conductive patterns 101a, 101b and each of the cells 11 is detected. In other words, it is detected which cells 11 are located above the conductive pattern 101a or 101b. This is done because there is a practical limitation on locating the inspection unit above the circuit board 100 with a sufficient accuracy and, in particular, the computer 4 is required to recognize the physical relationship between the above two with a high degree of accuracy when a microscopic size of conductive pattern to be inspected forces to use cells each having a corresponding microscopic size.

Graphical data (hereinafter referred to as "conductive pattern data") representing the position and shape of the conductive pattern to be inspected is stored in the computer 4 in advance. The computer 4 compares the conductive pattern data with the conductive pattern 101 actually detected by the inspection unit 1 to recognize the physical relationship between each of the cells 11 and the detected conductive pattern.

In the operation for recognizing the physical relationship, the physical relationship can be recognized by detecting the position of all or a part of a specific conductive pattern having a distinctively shaped portion which serves as a marker facilitating the detection using the inspection unit 1 or by providing a dummy conductive pattern serving as a marker in advance and then detecting the position of the dummy conductive pattern. The latter operation will herein be described in detail.

Figure 9:
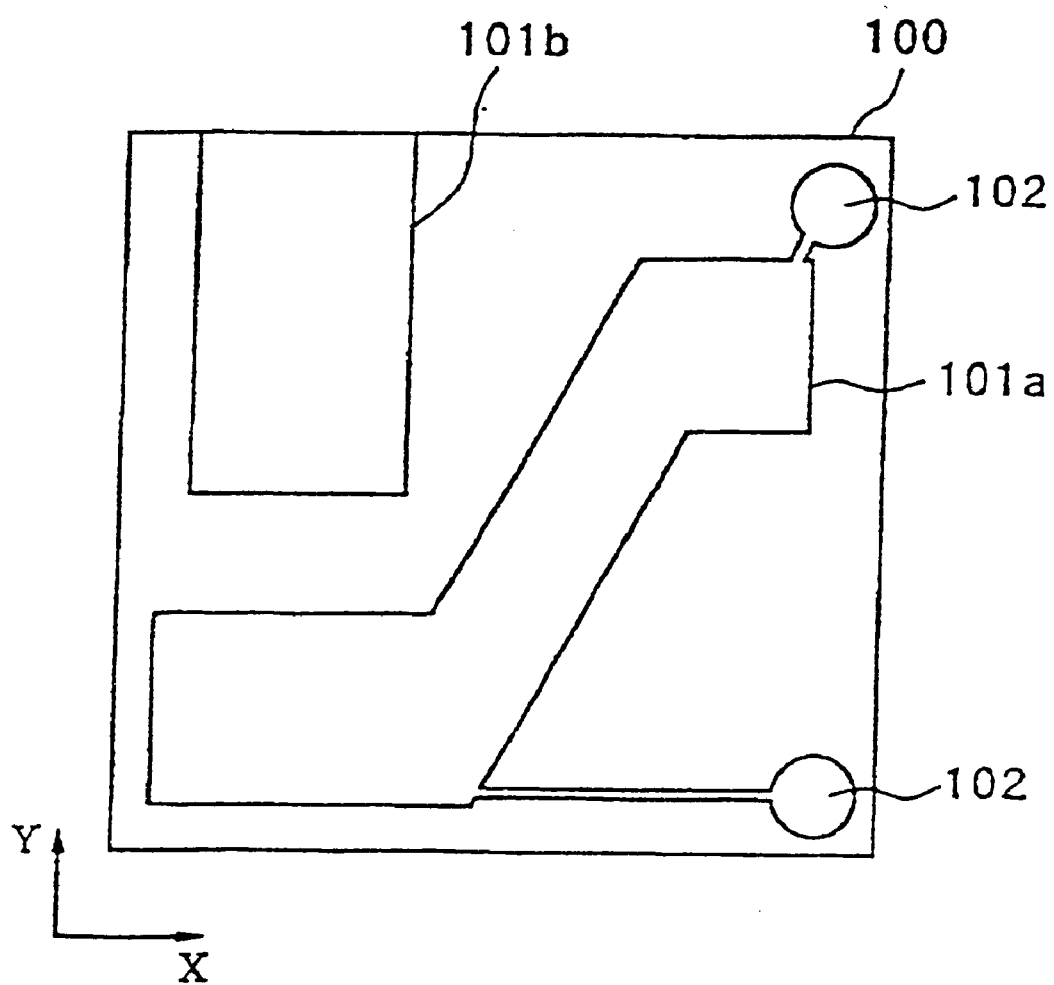
FIG. 9 shows a circuit board 100 having two dummy conductive patterns 102 printed formed thereon.

FIG. 9 shows a circuit board 100 formed with two dummy conductive patterns 102. Both of the conductive patterns 102 are connected with the conductive pattern 110a.

Figure 10:
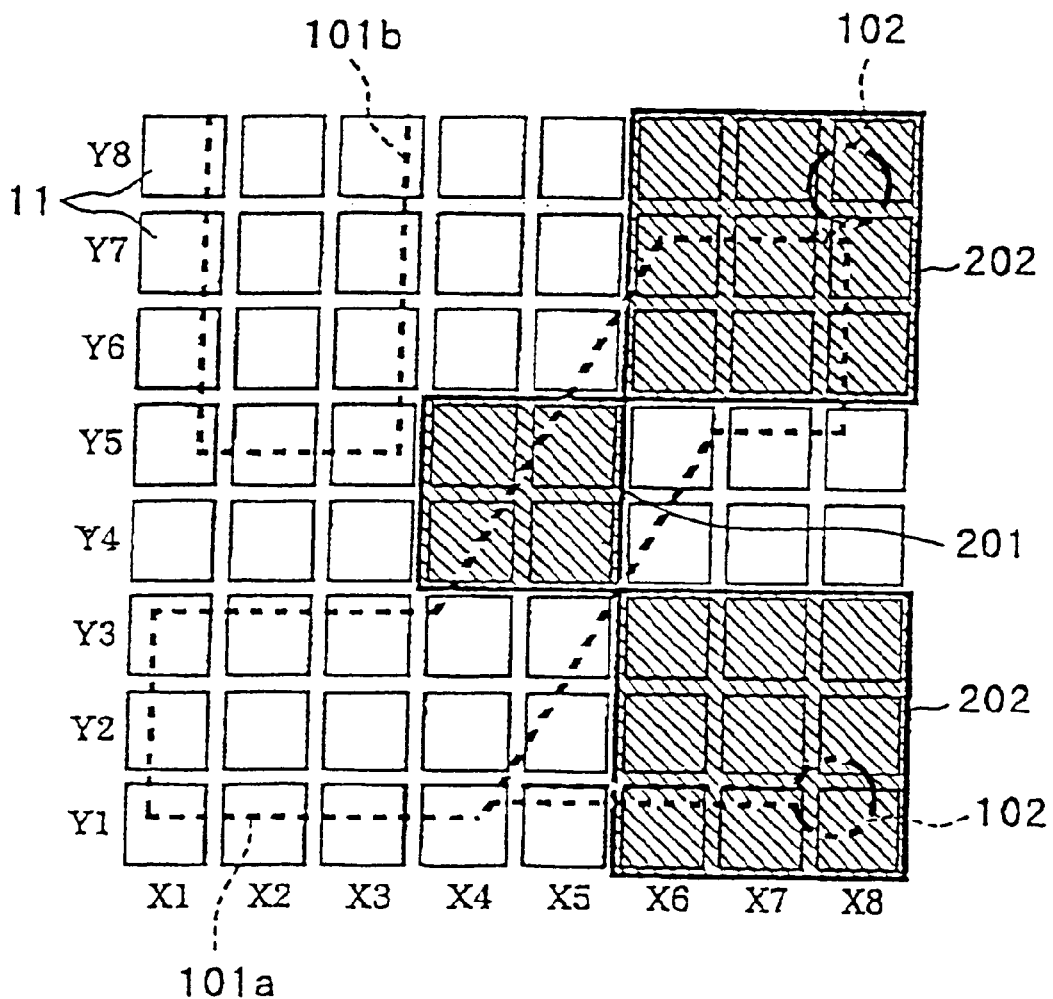
FIG. 10 shows the relationship between the conductive patterns 101a etc. and each of the sells 11 in an operation for detecting the coordinate of conductive patterns.

Supposing that the cells 11 are placed with respect to the circuit board 100 as shown in FIG. 10. The computer 4 has already recognized roughly the physical relationship between the conductive patterns 110a etc. and the cells 11 by referring to the conductive pattern data. Thus, the computer 4 selects a plurality of cells 11 which are or can be located above the conductive pattern 110a, and then switches all of selected cells simultaneously to the signal-supply side. The computer 4 also selects a plurality of cells 11 which are or can be located above the dummy conductive patterns 102 and switches the selected cells 11 to the signal-receive side in a sequential order. In FIG. 10, four cells 11 contained in a region 201 surrounded by the thick solid line are switched simultaneously to the signal-supply side, and eight cells 11 contained in a region 202 are switched to the signal-receive side in a sequential order.

Then, the inspection signal from the signal source 2 is input to the cells 11 contained in the region 201. This causes a current in the conductive patterns 110a and 102, and thereby the output signals can be obtained from the cells 11 contained in the region 202. The generated output signals are transmitted to the computer 4 through the processing circuit 3.

Figure 11:
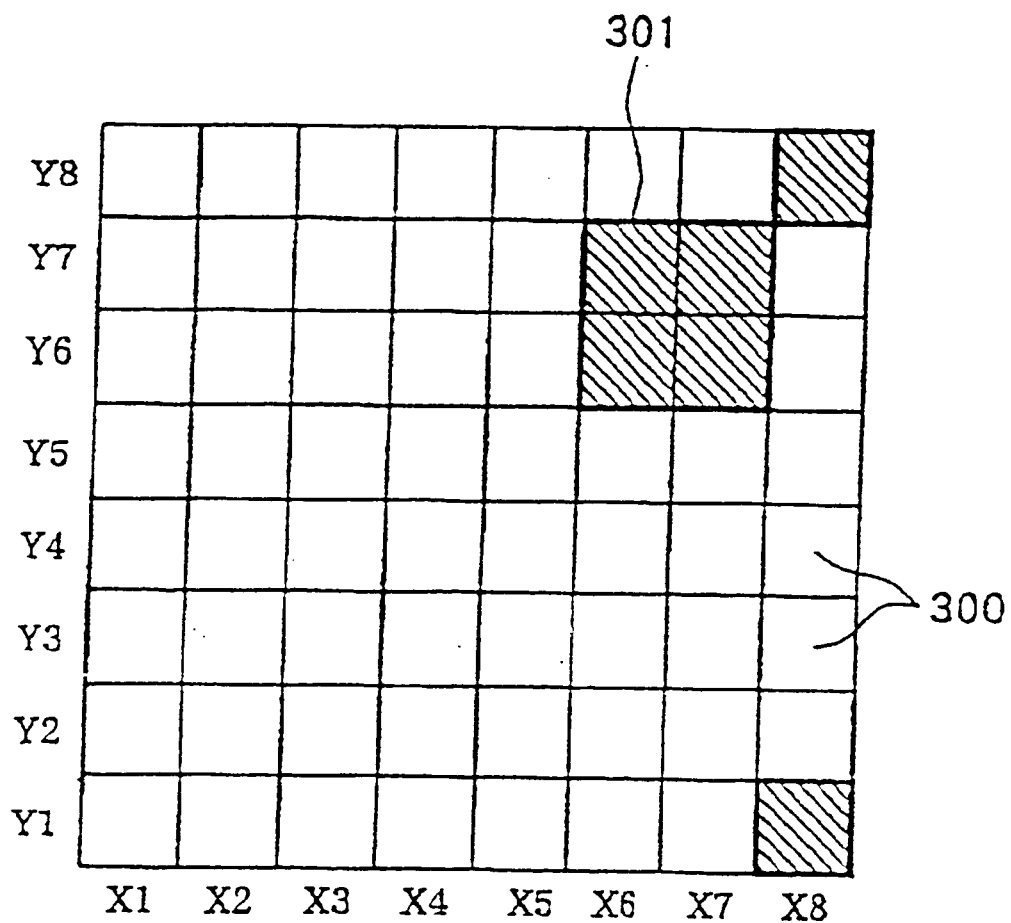
FIG. 11 is an exemplary view of an image on a display 4a in the operation for detecting the coordinate of conductive patterns.

The computer 4 can recognize each position of the dummy conductive patterns 102 based on the above output signals to specify the physical relationship between each of the cells 11 and the conductive patterns 101a and 101b. The computer 4 can also form image data by using the output signal from each of the cells 11 as a pixel signal to indicate an image associated with the image data on the display 4a. FIG. 11 shows an example of an image on the display 4a, wherein each pixel 300 corresponds to each of the cells 11. A pixel (X8, Y8) and a pixel (X8, Y1) represent the two dummy conductive patterns 102, respectively, and the region 301 surrounded by the thick solid line indicates a part of the conductive pattern 101a. In this case, instead of automatically recognizing a specific pixel 300 corresponding to each of the conductive patterns 102 by the computer 4, any staff associated with the inspecting operation may instruct the specific pixel.

The reason for providing two separate dummy conductive patterns 102 is to allow the physical relationship to be identified in consideration of the X and Y directions and in terms of orientation.

<Operation for Inspecting Disconnection>

Figure 12:
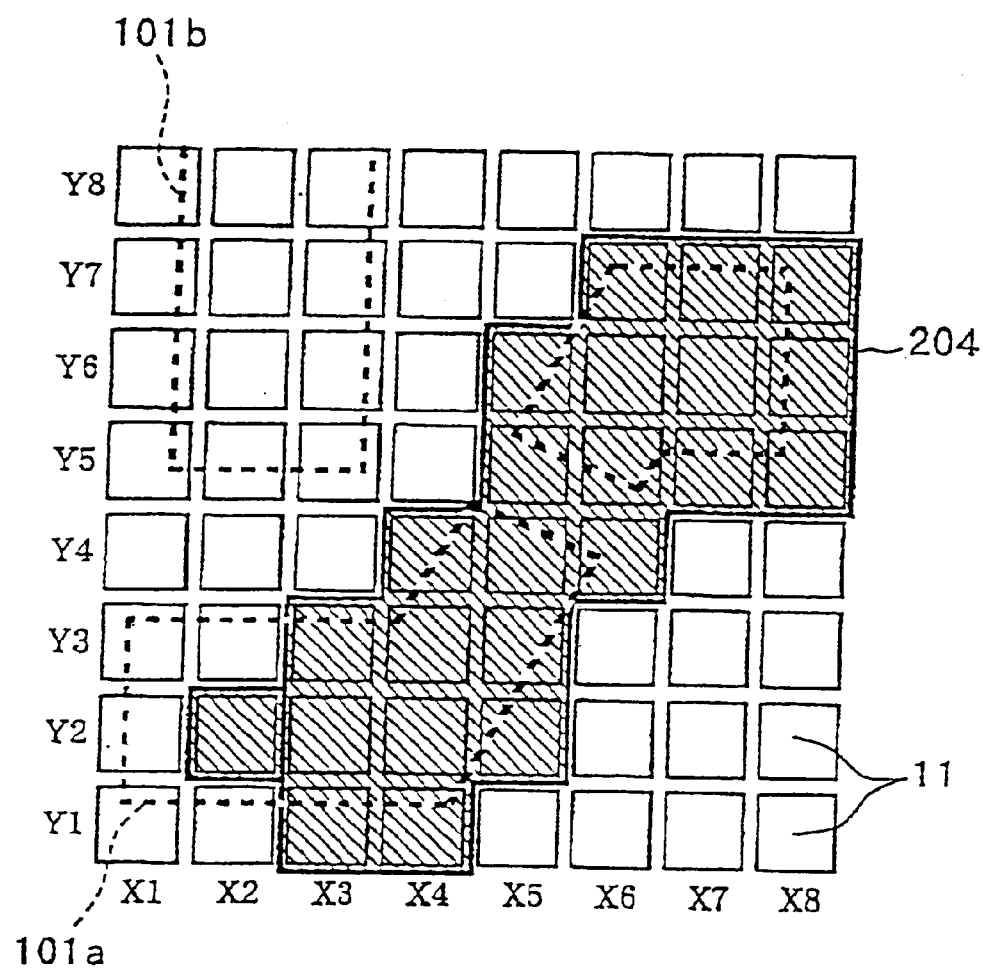
FIG. 12 shows the relationship between the conductive patterns 101a etc. and each of the sells 11 in an operation for inspecting disconnection in conductive patterns.

An operation for inspecting the presence of disconnection in the conductive pattern by use of the inspection apparatus A will now be described. FIG. 12 shows the physical relationship between the conductive patterns 101a, 101b and each of the cells 11 in the operation for inspecting the conductive pattern 101a having a specific disconnection. The dummy conductive patterns are omitted in FIG. 12.

The computer 4 first selects one cell 11 or a group of cells 11 to be switched to the signal-supply side from the cells 11 located above the conductive pattern 101a. Supposing that the cell (X2, Y2) is selected herein. The computer 4 also selects the cells 11 located above the conductive pattern 101a and around the boundary of the conductive pattern 101a as the cells 11 to be switched to the signal-receive side. Supposing that the cells 11 contained in the region 204 surrounded by the thick solid line are selected.

In this selecting operation, it is to be understood that the cells 11 are specified based on the information of the conductive pattern data and the physical relationship between the conductive pattern and the cells, which have been obtained by the processing described in <Operation for detecting Coordinate of Conductive Pattern>.

The computer 4 transmits the control signal to the switching circuit 16 of the inspection unit 1 to make the cell (X2, Y2), the cells 11 contained in the region 204 and the remaining cells 11 connect with the input terminal 12, the output terminal 13 in a sequential order and the GND terminal 15, respectively.

Then, the inspection signal from the signal source 2 is input to the cell (X2, Y2). Thus, a current is caused in the conductive pattern 101a and the output signals are generated sequentially from the cells 11 contained in the region 204. The generated output signals are transmitted to the computer 4 through the processing circuit 3, and then the computer 4 determines the presence of disconnection by comparing each of the output signals with the conductive pattern data based on a given threshold value. It is to be understood that the threshold value can be set as with the operation described in <Operation for inspecting Disconnection> of <<Inspection Method 1>>.

Figure 13:
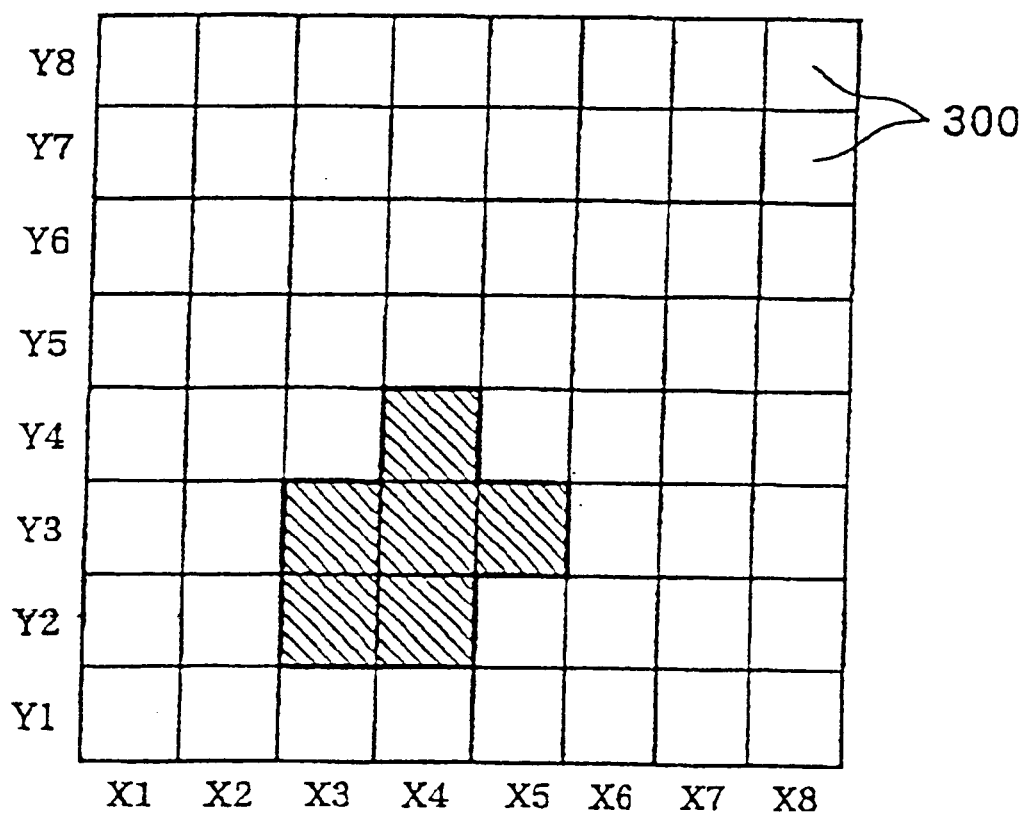
FIG. 13 is an exemplary view of an image on the display 4a in the operation for inspecting disconnection in conductive patterns.

The computer 4 can also form image data representing the position and shape of the detected conductive pattern by using the output signals as pixel signals. The computer 4, herein, forms the image data by binarizing the pixel signals based on the threshold value, and then indicates an image associated with the image data on the display 4a. FIG. 13 shows an example of such an image.

As shown in FIG. 12, the conductive pattern 101a is disconnected around the position corresponding to the cell (X5, Y4). Correspondingly, in the example in FIG. 13, the image has a gap around the pixel (X5, Y4). This indicates the presence of disconnection and the position of the disconnection. While the image signal has been binarized in the above embodiment, it is apparent that the image signal may also be multivalued.

<Operation for Inspecting Short Circuit>

Figure 14:
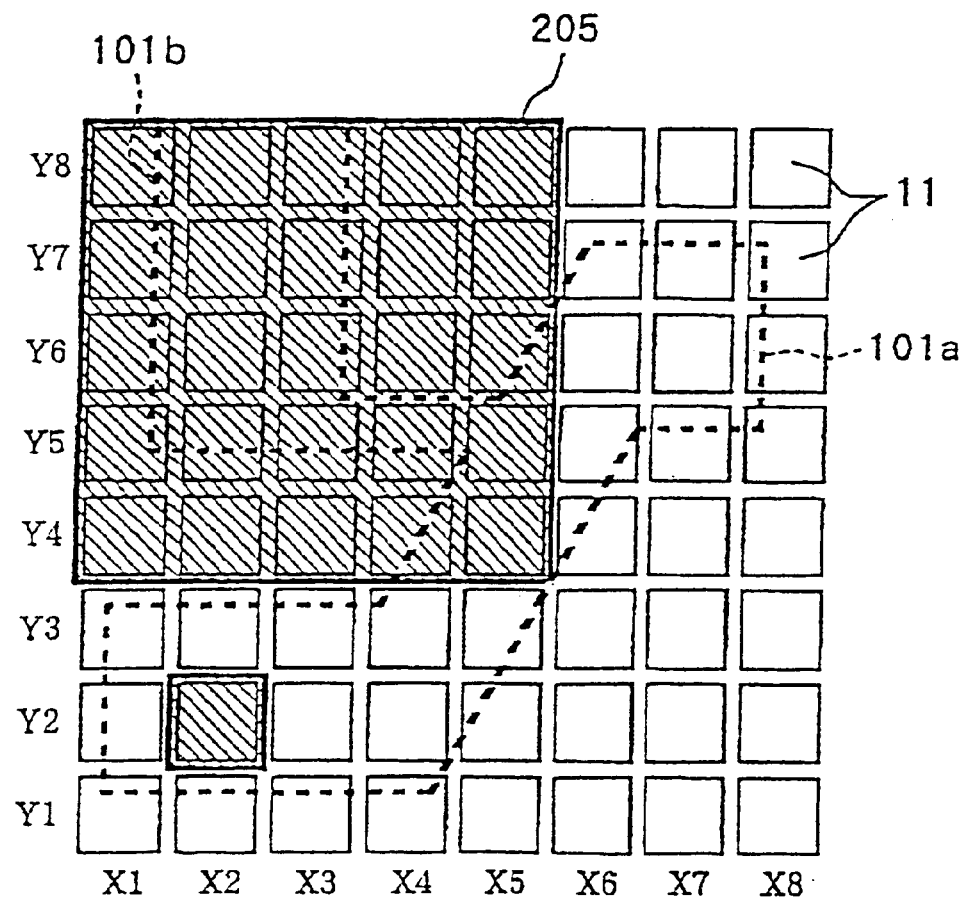
FIG. 14 shows the relationship between the conductive patterns 101a etc. and each of the sells 11 in an operation for inspecting short circuit in conductive patterns.

An operation for inspecting the presence of short circuit in the conductive patterns by use of the inspection apparatus A will now be described. FIG. 14 shows the physical relationship between the conductive patterns 101a, 101b and each of the cells 11 in the operation for inspecting the conductive patterns 101a, 101b having a specific short circuit.

The computer 4 first selects one cell 11 or a group of cells 11 to be switched to the signal-supply side from the cells 11 located above the conductive pattern 110a or the conductive pattern 101b. Supposing that the cell (X2, Y2) is selected herein. The computer 4 then selects the cells 11 located above the conductive pattern 110a or the conductive pattern 101b as the cells 11 to be switched to the signal-receive side. Supposing that the cells 11 contained in the region 205 surrounded by the thick solid line are selected.

The computer 4 transmits the control signal to the switching circuit 16 of the inspection unit 1 to make the cell (X2, Y2), the cells 11 contained in the region 205 and the remaining cells 11 connect with the input terminal 12, the output terminal 13 in a sequential order and the GND terminal 15, respectively.

Then, the inspection signal from the signal source 2 is input to the cell (X2, Y2). Thus, if the conductive patterns 101a and 101b are short-circuited, a current flows between the conductive patterns 110a and 101b, and thereby the output signals are generated sequentially from each of the cells 11 located above the conductive pattern 101b. The generated output signals are transmitted to the computer 4 through the processing circuit 3, and then the computer 4 determines the presence of short circuit and specifies the position of the short circuit by comparing each of the output signals with the conductive pattern data based on a given threshold value.

Figure 15:
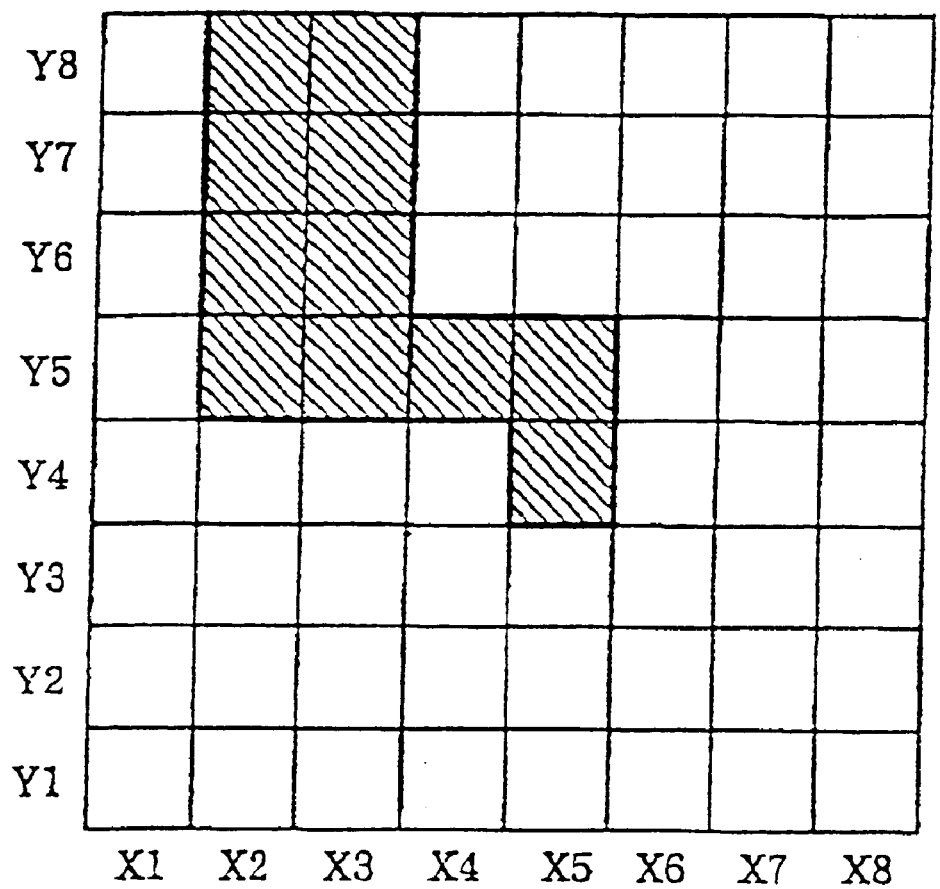
FIG. 15 is an exemplary view of an image on the display 4a in the operation for inspecting short circuit in conductive patterns.

The computer 4 also forms image data representing the position and shape of the detected conductive pattern by using the output signals as pixel signals to indicate an image associated with the image data on the display 4a. FIG. 15 shows an example of such an image.

As shown in FIG. 14, the conductive patterns 101a and 101b are short-circuited around the position corresponding to the cell (X4, Y5). Correspondingly, in the example in FIG. 15, the image appears on the region corresponding to the conductive patterns 101b and additionally around the pixel (X5, Y4) corresponding to the region having the short circuit. This indicates the presence of short circuit and the position of the short circuit.

<Operation for Inspecting Chipping>

Figure 16:
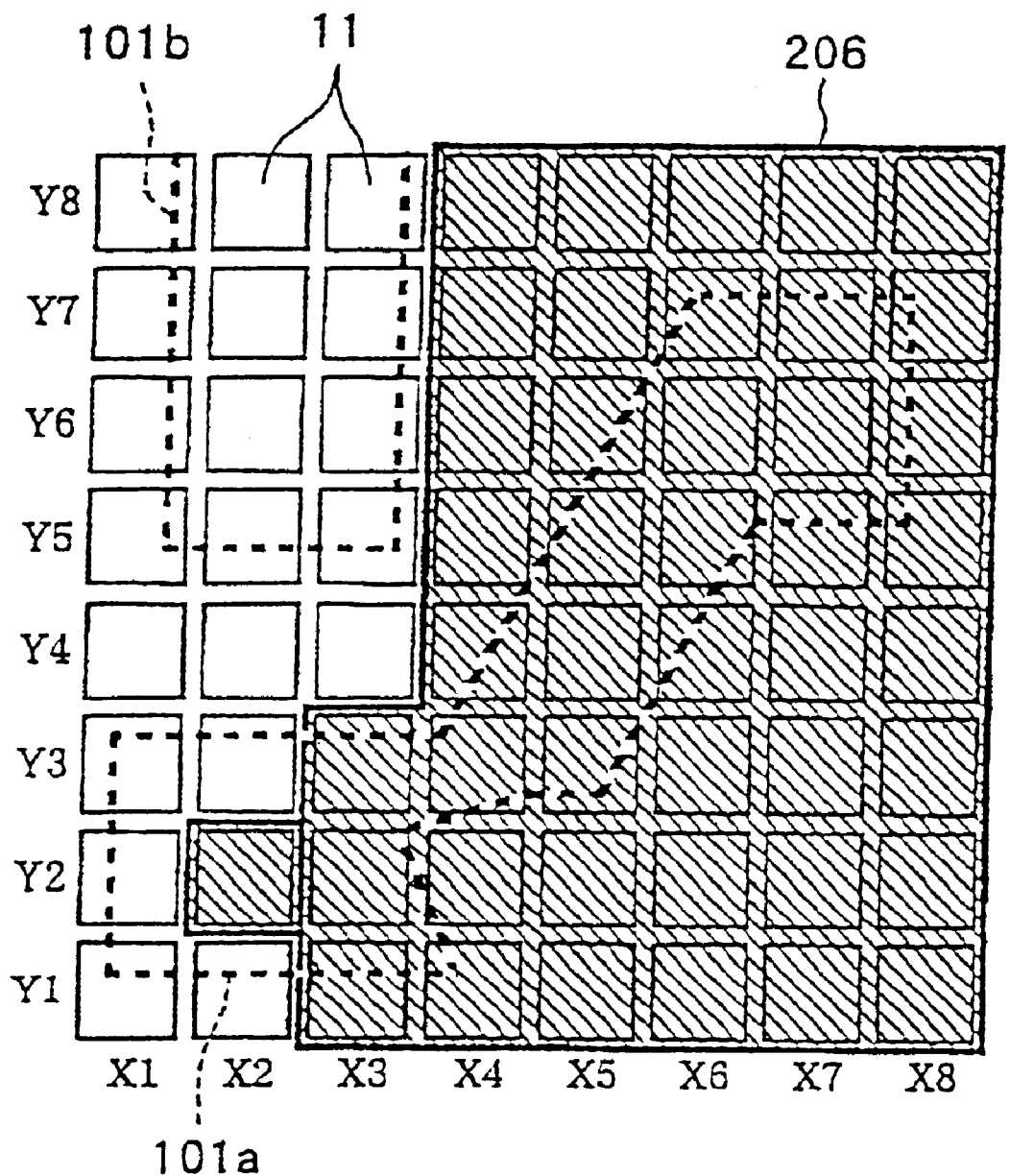
FIG. 16 shows the relationship between the conductive patterns 101a etc. and each of the sells 11 in an operation for inspecting chipping in conductive patterns.

An operation for inspecting the presence of chipping in the conductive patterns by use of the inspection apparatus A will now be described. The term "chipping" herein means that a conductive pattern has no disconnection but partially includes a broken or chipped portion. FIG. 16 shows the physical relationship between the conductive patterns 101a, 101b and each of the cells 11 in the operation for inspecting the conductive pattern 101a having a specific chipping.

The computer 4 first selects one cell 11 or a group of cells 11 to be switched to the signal-supply side from the cells 11 located above the conductive pattern 101a. Supposing that the cell (X2, Y2) is selected herein. The computer 4 then selects the cells 11 located above or around the conductive pattern 101a as the cells 11 to be switched to the signal-receive side. Supposing that the cells 11 contained in the region 206 surrounded by the thick solid line are selected.

The computer 4 transmits the control signal to the switching circuit 16 of the inspection unit 1 to make the cell (X2, Y2), the cells 11 contained in the region 206 and the remaining cells 11 connect with the input terminal 12, the output terminal 13 in a sequential order and the GND terminal 15, respectively.

Then, the inspection signal from the signal source 2 is input to the cell (X2, Y2). Thus, a current flows through the conductive patterns 110a, and thereby the output signals are generated sequentially from each of the cells 11 located above the conductive pattern 110a. The generated output signals are transmitted to the computer 4 through the processing circuit 3, and then the computer 4 determines the presence of chipping and specifies the position of the chipping by comparing each of the output signals with the conductive pattern data based on a given threshold value.

Figure 17:
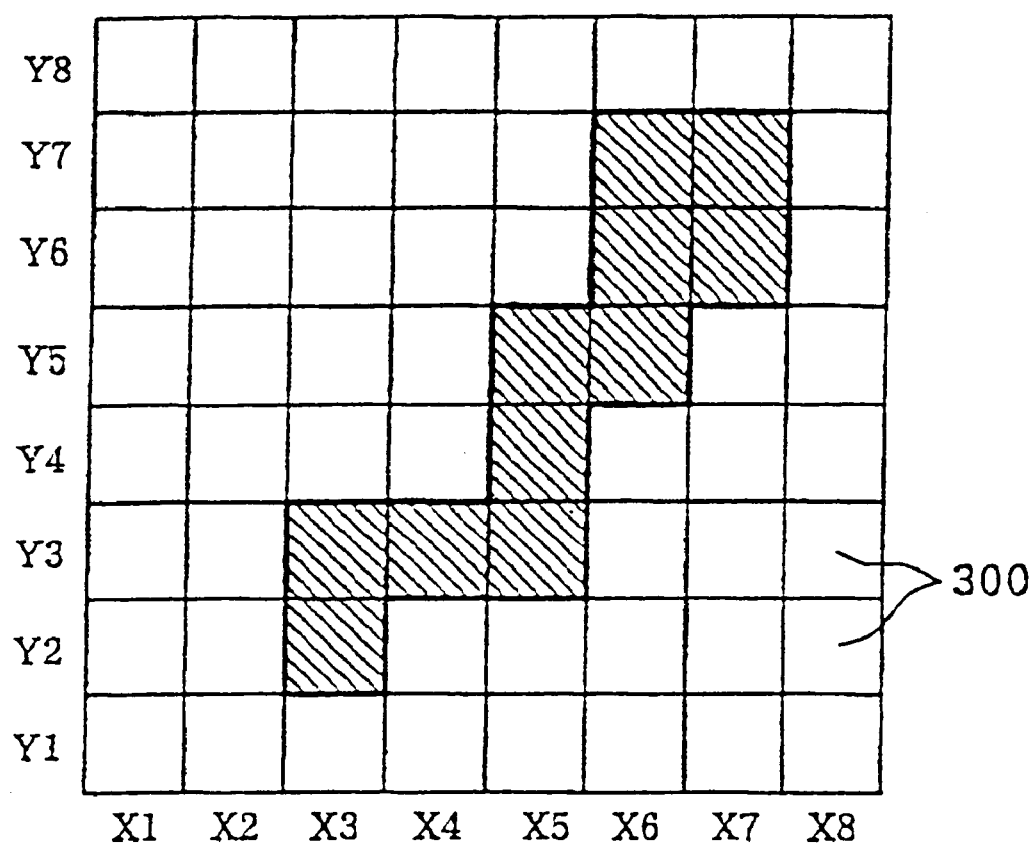
FIG. 17 is an exemplary view of an image on the display 4a in the operation for inspecting chipping in conductive patterns.

The computer 4 also forms image data representing the position and shape of the detected conductive pattern by using the output signals as pixel signals to indicate an image associated with the image data on the display 4a. FIG. 17 shows an example of such an image.

As shown in FIG. 16, the conductive pattern 110a has a specific chipping around the position corresponding to the cell (X4, Y2). Correspondingly, in the example in FIG. 15, no image appears at the pixel (X4, Y2) corresponding to the portion having the chipping. This indicates the presence of chipping and the position of the chipping.

INDUSTRIAL APPLICABILITY

As described above, the present invention allows various inspecting operations of conductive patterns to be achieved in a complete non-contact manner.

What is claimed is:

1. An inspection apparatus for inspecting a conductive pattern of a circuit board in a non-contact manner without resorting to photons, said inspecting apparatus comprising:

a plurality of conductive cells arranged with leaving a space therebetween;

supply means for supplying an inspection signal having temporal variations to at least one of said cells;

processing means for processing an output signal appearing at another at least one of said cells;

switching means for allowing each of said cells to be connected individually with either one of said supply means and said processing means; and control means for controlling said switching means.

2. An inspection apparatus as defined in claim 1, which further includes determining means for determining at least either one of disconnection and short circuit in said conductive patterns based on said output signal.

3. An inspection apparatus as defined in claim 2, wherein when inspecting the disconnection or the short circuit, said determining means is adapted to determine the presence of the disconnection or the short circuit based on whether the intensity of said output signal exceeds a given threshold value.

4. An inspection apparatus as defined in claim 2, wherein said circuit board includes a plurality of conductive patterns, wherein when inspecting the disconnection or the short circuit, said determining means is adapted to determine the presence of the disconnection or the short circuit by inspecting different ones of said conductive patterns and then comparing respective intensities of the output signals obtained from said inspections.

5. An inspection apparatus as defined in claim 1, which further includes storage means having stored conductive pattern data associated with the position and shape of said conducting pattern therein.

6. An inspection apparatus as defined in claim 5, wherein said control means is adapted to specify the cell to be switched by said switching means based on said conductive pattern data.

7. An inspection apparatus as defined in claim 1, which further includes means for generating image data of an image representing the position and shape of the inspected conductive pattern based on said output signal appearing at each of said cells.

8. An inspection apparatus as defined in claim 7, which further includes means for displaying said image.

9. An inspection apparatus as defined in claim 7, wherein said control means is adapted to control said switching means to connect at least one of said cells with said supply means and simultaneously to connect all of another cells or a part of another cells belonging to a certain region sequentially with said processing means one by one, so as to generate said image data.

10. An inspection apparatus as defined in claim 7, wherein when inspecting the disconnection of said conductive pattern, said control means is adapted to control said switching means to connect at least one of said cells located above one end of said inspected conductive pattern with said supply means and simultaneously to connect one of the cells located above the other end of said inspected conductive pattern with said processing means or connect plural ones of the cells located above the other end of said inspected conductive pattern sequentially with said processing means.

11. An inspection apparatus as defined in claim 7, wherein said circuit board includes a plurality of conductive patterns, wherein when inspecting the short circuit between a pair of said conductive patterns, said control means is adapted to control said switching means to connect at least one of the cells located above one of said inspected conductive patterns with said supply means and simultaneously to connect one of the cells located above the other inspected conductive pattern with said processing means or connect plural ones of the cells located above the other inspected conductive pattern sequentially with said processing means.

12. An inspection apparatus as defined in claim 7, wherein when inspecting the chipping of said conductive pattern, said control means is adapted to control said switching means to connect at least one of the cells located above said inspected conductive pattern with said supply means and simultaneously to connect another cells sequentially with said processing means, said another cells being other than said cells located above and around said inspected conductive pattern and connected with said supply means.

13. An inspection apparatus as defined in claim 7, which further includes storage means to store conductive pattern data associated with the position and shape of said conducting pattern therein, and means for determining at least either one of disconnection, short circuit and chipping in said conductive patterns by comparing said image data with said conductive pattern data.

14. An inspection apparatus as defined in claim 7, which further includes storage means to store conductive pattern data associated with the position and shape of each of said conducting patterns therein, and means for detecting the displacement of said inspected conductive pattern by comparing said image data with said conductive pattern data.

15. An inspection apparatus as defined in claim 14, wherein said comparison is performed based on a distinctively shaped portion included in said conductive pattern or a dummy conductive pattern formed on said circuit board in advance.

16. An inspection apparatus as defined in claim 1, wherein said switching means is adapted to connect each of said cells individually with either one of said supply means, said processing means, and the GND, wherein said control means is adapted to control the switching means to connect a specific cell in said cells with the GND, said specific cell being connected with neither said supply means nor said processing means.

17. An inspection apparatus as defined in claim 1, wherein said processing means is provided for each of said cells or each of cell groups each consisting of plural ones of said cells.

* * * * *